(12) United States Patent  
Gingrich, III et al.

(10) Patent No.: US 12,334,685 B2  
(45) Date of Patent: Jun. 17, 2025

(54) INTERCONNECTION SYSTEM FOR GROUND CURRENT OPTIMIZATION

(71) Applicant: TE Connectivity Solutions GmbH, Schaffhausen (CH)

(72) Inventors: Charles Raymond Gingrich, III, Mechanicsburg, PA (US); Scott Eric Walton, Mount Joy, PA (US); Rutger Wilhelmus Smink, Hamont-Achel (BE)

(73) Assignee: TE Connectivity Solutions GmbH (CH)

( * ) Notice: Subject to any disclaimer, the term of this patent is extended or adjusted under 35 U.S.C. 154(b) by 426 days.

(21) Appl. No.: 18/050,569

(22) Filed: Oct. 28, 2022

(65) Prior Publication Data

US 2024/0145994 A1 May 2, 2024

(51) Int. Cl.
*H01R 13/6471* (2011.01)
*H01R 12/72* (2011.01)
*H01R 13/6587* (2011.01)
*H01R 13/6588* (2011.01)

(52) U.S. Cl.
CPC ....... *H01R 13/6471* (2013.01); *H01R 12/724* (2013.01); *H01R 13/6587* (2013.01); *H01R 13/6588* (2013.01)

(58) Field of Classification Search
CPC ............ H01R 13/6471; H01R 13/6587; H01R 13/6588; H01R 12/724
USPC .................................................. 439/607.05
See application file for complete search history.

(56) References Cited

U.S. PATENT DOCUMENTS

| | | | |
|---|---|---|---|
| 7,242,592 B2 * | 7/2007 | Payne ................ | H01R 13/6471 174/265 |
| 7,422,484 B2 * | 9/2008 | Cohen .................... | H01R 12/00 439/607.05 |
| 7,621,781 B2 * | 11/2009 | Rothermel ......... | H01R 13/6467 439/607.05 |
| 8,803,003 B2 * | 8/2014 | Mantiply .......... | H01L 23/49838 174/262 |
| 9,923,309 B1 * | 3/2018 | Aizawa .................. | H05K 1/113 |
| 10,003,144 B1 | 6/2018 | Sharf | |
| 10,993,314 B2 | 4/2021 | Charbonneau et al. | |
| 10,998,678 B1 | 5/2021 | Miller et al. | |
| 11,025,014 B1 | 6/2021 | Miller et al. | |
| 2006/0024983 A1 * | 2/2006 | Cohen ................. | H01R 12/716 439/61 |
| 2006/0228912 A1 * | 10/2006 | Morlion ................. | H01R 12/00 439/65 |
| 2008/0227311 A1 * | 9/2008 | Chan .................. | H01R 13/6461 439/74 |
| 2013/0045638 A1 * | 2/2013 | Gui ..................... | H01R 13/6471 439/660 |
| 2013/0330941 A1 * | 12/2013 | Jeon ..................... | H01R 12/585 174/266 |

(Continued)

*Primary Examiner* — Gary F Paumen (57) ABSTRACT

A printed circuit board having signal contact receiving vias positioned in rows and ground contact receiving vias positioned in line with the signal contact receiving vias in the rows. Signal integrity vias are positioned between the signal contact receiving vias, between the ground contact receiving vias, and between respective signal contact receiving vias and respective ground contact receiving vias. The signal integrity vias form a ground fence which reduces cross talk in a foot print of a connector mated with the printed circuit board.

20 Claims, 7 Drawing Sheets

(56) References Cited

U.S. PATENT DOCUMENTS

| | | | |
|---|---|---|---|
| 2014/0080331 A1* | 3/2014 | Jeon | H01R 13/658 |
| | | | 439/55 |
| 2014/0209370 A1* | 7/2014 | Minich | G09B 23/183 |
| | | | 174/266 |
| 2016/0150645 A1* | 5/2016 | Gailus | H05K 1/0219 |
| | | | 174/262 |
| 2019/0159334 A1* | 5/2019 | Kagaya | H05K 1/0225 |
| 2019/0229472 A1* | 7/2019 | Pickel | H01R 12/73 |
| 2019/0380204 A1* | 12/2019 | Cartier, Jr. | H05K 1/115 |

* cited by examiner

INTERCONNECTION SYSTEM FOR GROUND CURRENT OPTIMIZATION

FIELD OF THE INVENTION

The present invention relates to interconnection systems for electrical connectors for ground current optimization to provide adequate shielding from crosstalk between signal lines. In particular, the invention relates to providing a ground fence in the circuit board to provide the desired noise cancellation.

BACKGROUND OF THE INVENTION

Due to the increasing complexity of electronic components, it is desirable to fit more components in less space on a circuit board or other substrate. Consequently, the spacing between electrical terminals within connectors and interconnection systems has been reduced, while the number of electrical terminals housed in the connectors and interconnection systems has increased, thereby increasing the need in the electrical arts for electrical connectors and systems that are capable of handling higher and higher speeds and to do so with greater and greater pin densities. It is desirable for such connectors and systems to have not only reasonably constant impedance levels, but also acceptable levels of crosstalk, as well as other acceptable electrical and mechanical characteristics. Therefore, there remains a need to provide appropriate shielding to preserve signal integrity and to minimize crosstalk as speeds of signals increase and the footprint of the connector maintains or increases density of signal pairs.

It would, therefore, be beneficial to provide an interconnection system with a ground shield provided in the circuit board to minimize crosstalk proximate the footprint of the connector. It would also be beneficial to a system with a robust, manufacturable connection without requiring additional components or complicated features in the shield component.

SUMMARY OF THE INVENTION

An embodiment is directed to a printed circuit board having signal contact receiving vias positioned in rows and ground contact receiving vias positioned in line with the signal contact receiving vias in the rows. Signal integrity vias are positioned between the signal contact receiving vias, between the ground contact receiving vias, and between respective signal contact receiving vias and respective ground contact receiving vias. The signal integrity vias form a ground fence which reduces cross talk in a foot print of a connector mated with the printed circuit board.

An embodiment is directed to a printed circuit board having signal contact receiving vias, first ground contact receiving vias and second ground contact receiving vias. The signal contact receiving vias are positioned in rows. The first ground contact receiving vias are positioned in line with the signal contact receiving vias in the rows. The first ground contact receiving vias are positioned between and edge of the circuit board and the signal contact receiving vias. The second ground contact receiving vias are positioned in line with the signal contact receiving vias in the rows. The second ground contact receiving vias are positioned between respective signal contact receiving vias. The second contact receiving vias have center-to-center spacing which is less than the center-to-center spacing between the signal contact receiving vias.

An embodiment is directed to a connector system. The connector system includes a backplane connector, a daughtercard connector, a backplane circuit board and a daughtercard circuit board. The backplane connector has first signal contacts and first ground contacts. The daughtercard connector has second signal contacts and second ground contacts. The backplane circuit board includes backplane signal contact receiving vias, backplane ground contact receiving vias and signal integrity vias. The backplane signal contact receiving vias are positioned in rows. The backplane ground contact receiving vias are positioned in line with the backplane signal contact receiving vias in the rows. The signal integrity vias are positioned between the backplane signal contact receiving vias, between the backplane ground contact receiving vias, and between respective backplane signal contact receiving vias and respective backplane ground contact receiving vias. The daughtercard circuit board includes daughtercard signal contact receiving vias, first daughtercard ground contact receiving vias and second daughtercard ground contact receiving vias. The daughtercard signal contact receiving vias are positioned in rows. The first daughtercard ground contact receiving vias are positioned in line with the daughtercard signal contact receiving vias in the rows. The first daughtercard ground contact receiving vias are positioned between and edge of the daughtercard circuit board and the daughtercard signal contact receiving vias. The second daughtercard ground contact receiving vias positioned in line with the daughtercard signal contact receiving vias in the rows. The second daughtercard ground contact receiving vias are positioned between respective daughtercard signal contact receiving vias. The daughtercard second contact receiving vias have center-to-center spacing which is less than the center-to-center spacing between the daughtercard signal contact receiving vias.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. For example, the term "row" is not meant to imply a particular orientation, as vertical and horizontal (such as columns) orientations are construed to be rows. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 1:
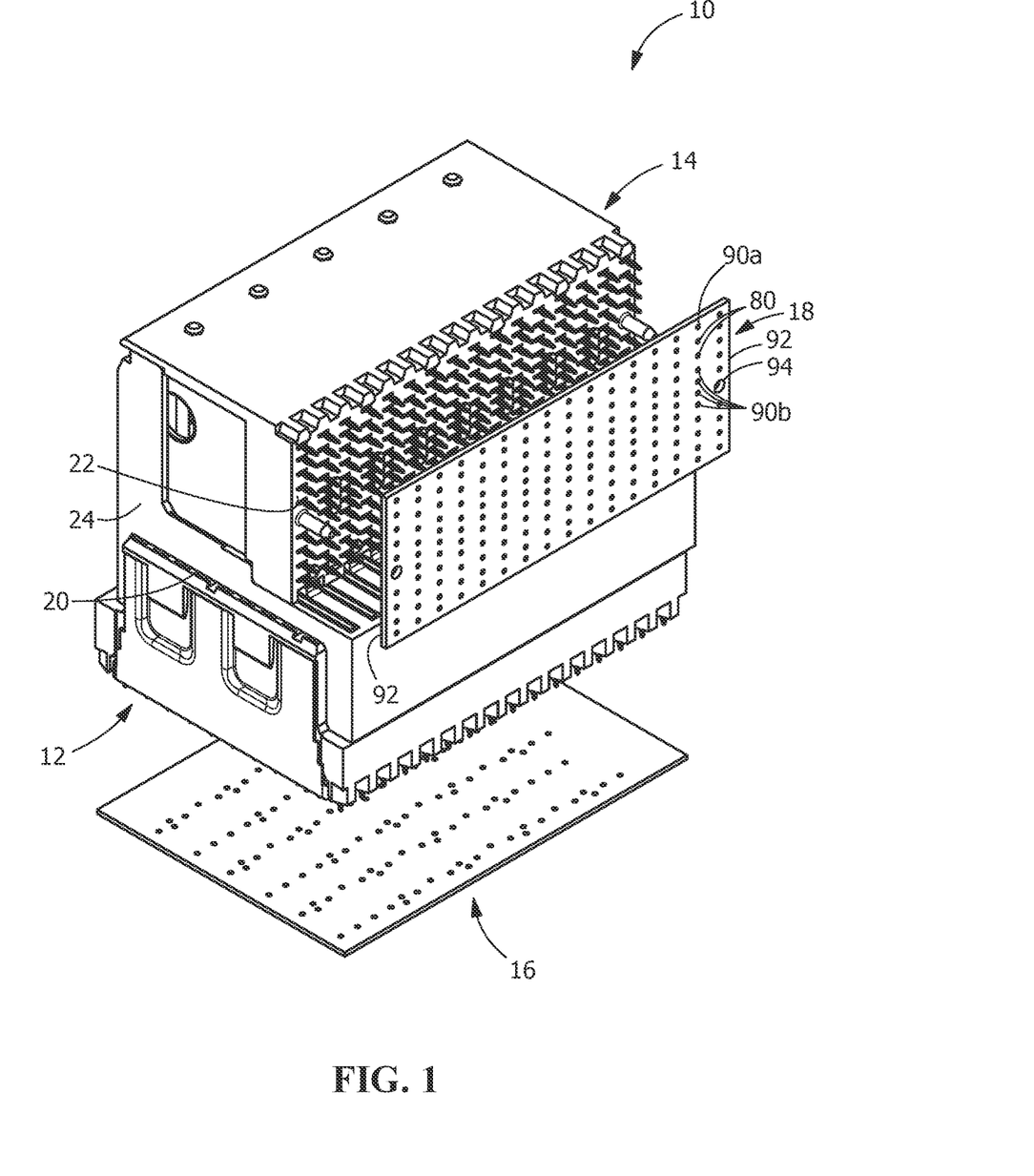
FIG. 1 is an exploded view of an illustrative connector system having a high speed electrical connector, a backplane and a daughter board.

FIG. 1 illustrates an illustrative electrical interconnection system 10 having a backplane connector 12 and a daughtercard connector 14 that are used to electrically connect a backplane circuit board 16 and a daughtercard circuit board 18. The backplane connector 12 and the daughtercard connector 14 are merely illustrative embodiments of the types of electrical connectors used in the interconnection system 10. The backplane connector 12 and a daughtercard connector 14 may have varying configurations, including, but not limited to the type of connectors shown and described in co-pending U.S. patent application Ser. No. 18/050,523, which is incorporated in its entirety herein.

In the illustrative embodiment shown, the daughtercard connector 14 constitutes a right angle connector wherein a mating interface 20 and mounting interface 22 of the daughtercard connector 14 are oriented perpendicular to one another. The daughtercard connector 14 is mounted to the daughtercard circuit board 18 at the mounting interface 22. Other orientations of the interfaces 20, 22 are possible in alternative embodiments.

Figure 2:
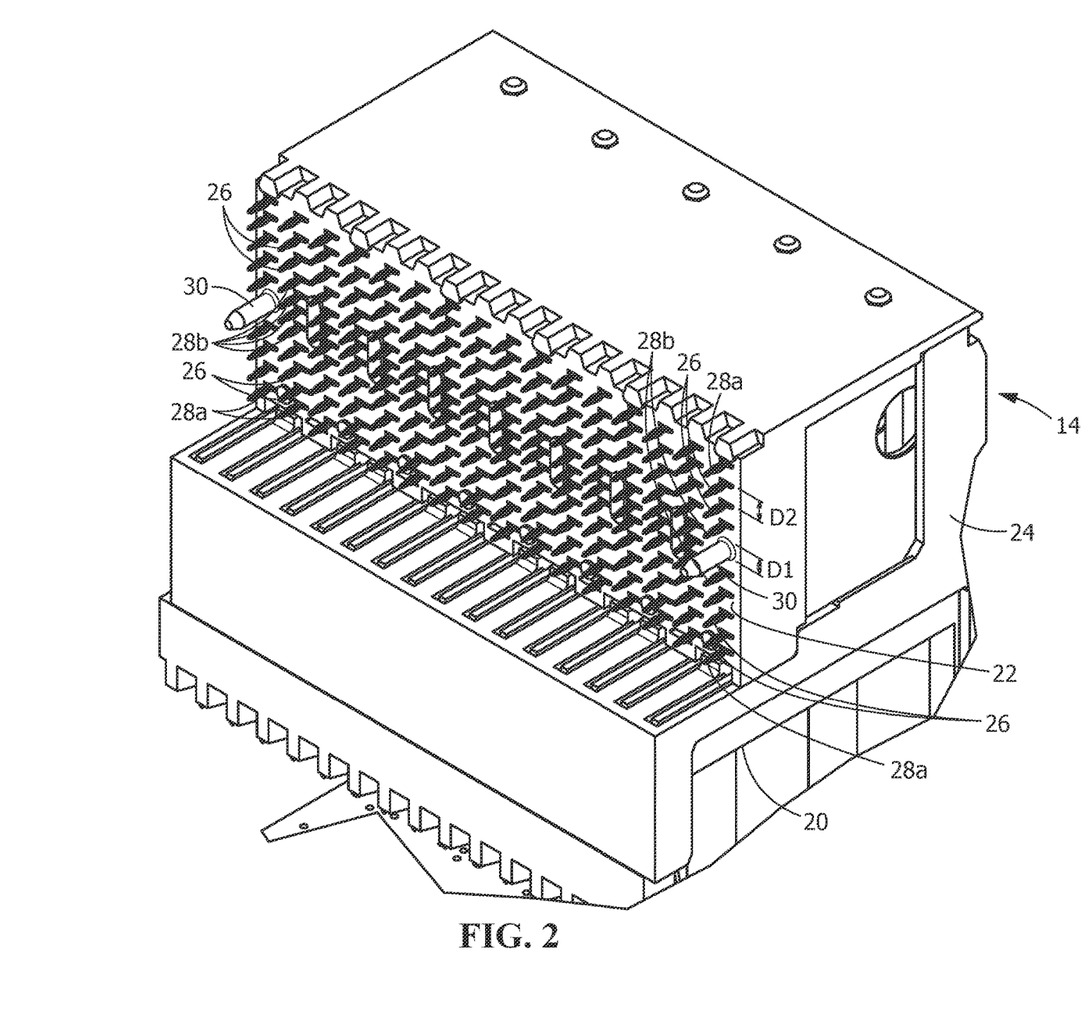
FIG. 2 is a front perspective view of the daughtercard connector of the electrical connector of FIG. 1.

As shown in FIG. 2, the daughtercard connector 14 includes a housing 24, made of one or more components, holding a plurality of circuit boards therein. The circuit boards have pairs of individual signal pathways or traces (not shown) that extend between the mating interface 20 and the mounting interface 22. The signal traces have signal mounting pins 26 extending from the mounting interface 22. The circuit boards have individual ground pathways or traces (not shown) that extend between the mating interface 20 and the mounting interface 22. The ground traces have ground mounting pins 28a, 28b extending from the mounting interface 22. In the illustrative embodiment shown, the signal mounting pins 26 and the ground mounting pins 28 are compliant eye of the needle pins, although other configurations may be used. In alternative embodiments, the circuit boards may be contact modules, the signal traces may be mating signal contacts and the ground traces may be ground contacts.

In the illustrative embodiment shown in FIGS. 1 and 2, the daughtercard connector 14 has first ground traces with first ground mounting pins 28a and second ground traces with second ground mounting pins 28b. The first ground mounting pins 28a are positioned between a side of the housing 24 and a respective signal mounting pin 26. The second ground mounting pins 28b are positioned between respective signal mounting pins 26. The spacing D1 between the second ground mounting pins 28b is less than the spacing D2 between the signal mounting pins 26.

Mounting and positioning post 30 extend from the mating interface 20 of the daughtercard connector 14. The mounting and positioning posts 30 are positioned proximate side walls of the housing 24. The mounting and positioning posts 30 are occupy the space of two second ground mounting pins 28b is each row in which the mounting and positioning posts 30 are positioned. Other configurations and positioning of the mounting and positioning posts 30 may be used.

The daughtercard connector 14 may have one or more ground plates (not shown) with ground plate mounting pins (not shown). The ground plates may be positioned to extend between the signal mounting pins 26.

Figure 3:
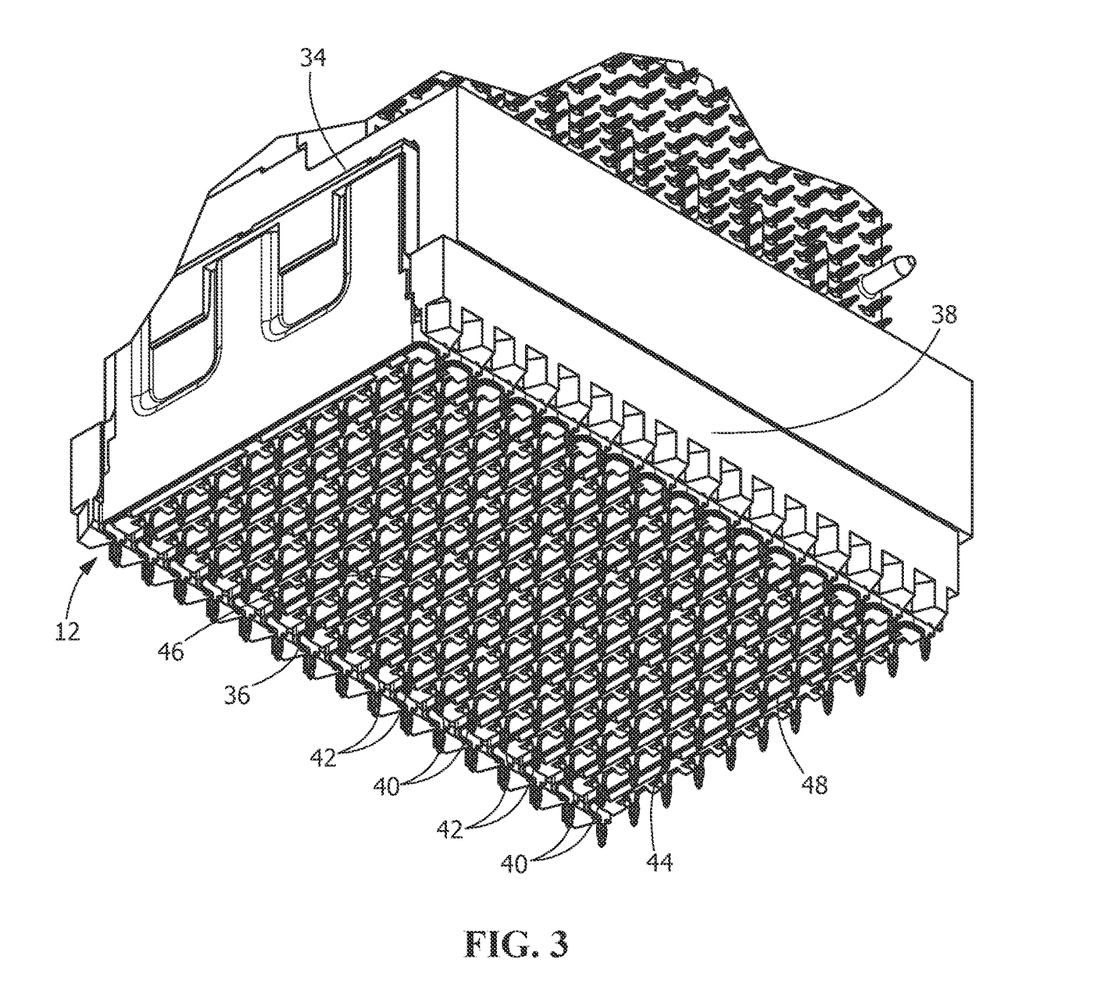
FIG. 3 is a bottom perspective view of the backplane connector of the electrical connector of FIG. 1.

As shown in FIG. 3, the backplane connector 12 includes a mating end 34 and a mounting end 36 that are oriented generally parallel to one another. The backplane connector 12 is mounted to the backplane circuit board 16 at the mounting end 36. Other orientations of the mating end 34 and the mounting end 36 are possible in alternative embodiments.

The backplane connector 12 includes a one piece housing 38. Alternatively, the housing may include a plurality of individual housings or modules. The housing 38 holds a at least one row of contacts 40, which include signal contacts 42 and ground contacts 44. In the exemplary embodiment, the signal contacts 40 are arranged in pairs carrying differential signals. However, in other configurations, the signal contacts 40 may not be arranged in pairs for carrying differential signals.

Each signal contact 40 has a signal circuit board mounting section 44. Each ground contact 42 has a ground circuit board mounting section 46. In the illustrative embodiment shown, the signal circuit board mounting sections 44 and the ground circuit board mounting sections 46 are compliant eye of the needle pins, although other configurations may be used.

The backplane connector 12 may have one or more ground plates 48. The ground plates 48 may be positioned to extend between rows of contact 40, 42. The ground plates, may be, but are not limited to, the type of ground contacts shown and described in US Patent Application TE-04722, which is incorporate herein in its entirety.

Figure 4:
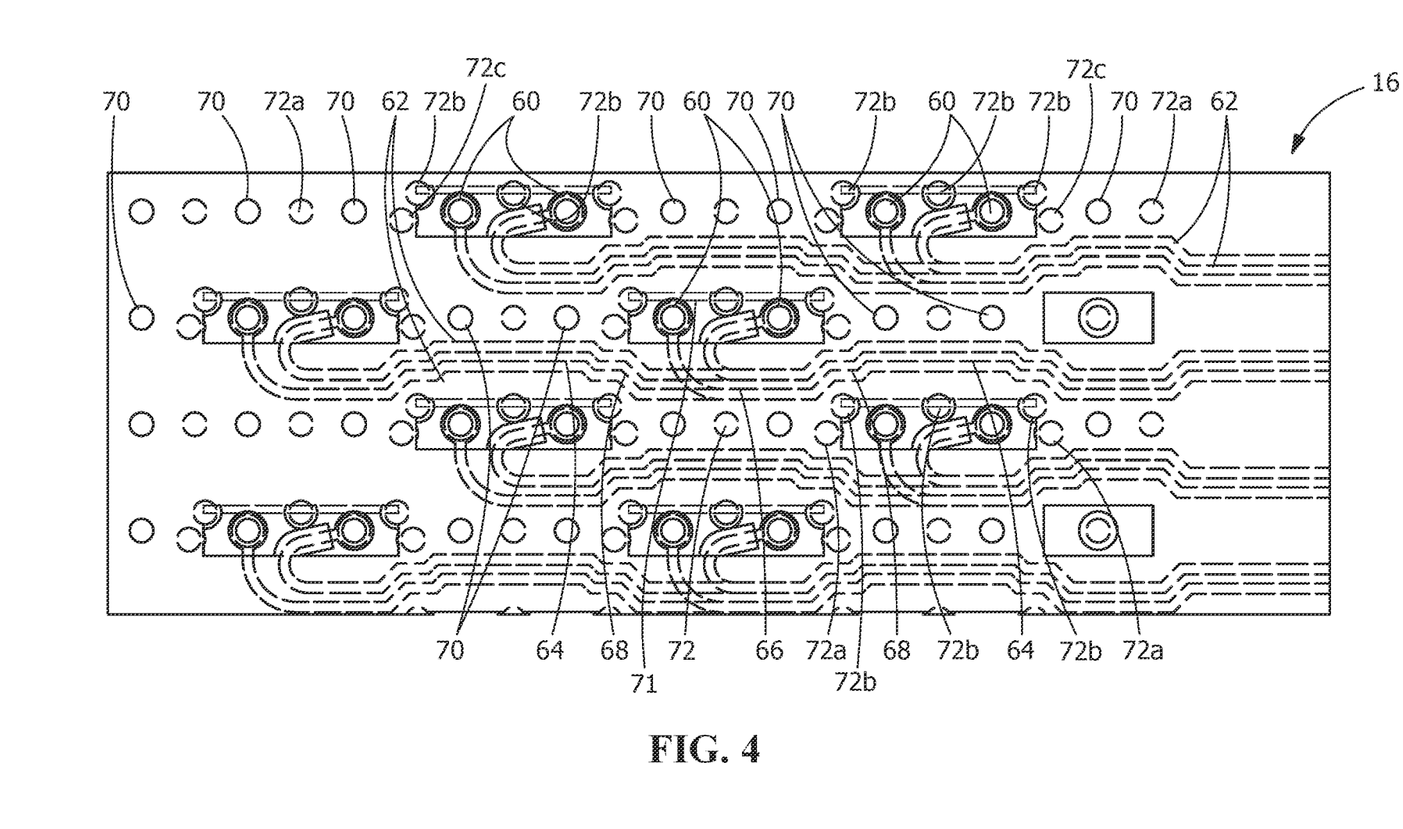
FIG. 4 is a top view of the backplane similar to that shown in FIG. 1.

Referring to FIG. 4, an illustrative example of a backplane circuit board 16 is shown. The backplane circuit board 16 may be, but is not limited to, a printed circuit board.

The backplane circuit board 16 has signal contact receiving through-holes or vias 60 which are configured and positioned to electrically and mechanically engaged the signal circuit board mounting sections 44 of the signal contacts 40 of the backplane connector 12. In the embodiment shown, the signal contact receiving vias 60 are arranged in pairs carrying differential signals.

Signal contact traces 62 are provided on the backplane circuit board 16 and terminate at respective signal contact receiving vias 60. In the illustrative embodiment shown, each of the signal contact traces 62 have multiple first portions 64 which are positioned in line with each other and multiple second portions 66 which are positioned in line with each other. The first portions 64 and the second portions 66 are offset from each other. Step or transition portions 68 are positioned between the first portions 64 and the second portions 66. The signal contact traces 62 from the differential pair of the signal contact receiving vias 60 may be on different layers of the backplane circuit board 16.

The backplane circuit board 16 has ground contact receiving through-holes or vias 70 which are configured and positioned to electrically and mechanically engaged the ground circuit board mounting sections 46 of the ground contacts 42 of the backplane connector 12. In the embodiment shown, respective ground contact receiving vias 70 are arranged in line and spaced from respective signal contact receiving vias 60. It will be understood that the pattern or positioning of the signal contact vias 60 and the ground contact receiving vias 70 matches the pattern of the signal circuit board mounting sections 44 and the ground circuit board mounting sections 46 of the backplane connector 12.

The backplane circuit board 16 has signal integrity vias or shadow vias 72. The signal integrity vias 72 are proximate to or between the signal contact receiving vias 60 and/or the ground contact receiving vias 70. In the illustrative embodiment shown in FIG. 4, the various signal integrity vias 72a are positioned in line with an axis of a row of respective signal contact receiving vias 60 and ground contact receiving vias 70. Other respective signal integrity vias 72b are positioned above the axis of the row, while other respective signal integrity vias 72c are positioned below the axis of the row.

The signal integrity vias 72 do not accept the mounting sections 44, 46 of the contacts 40, 42 and may have a different (smaller or larger) diameter than the signal contact receiving vias 60 and the ground contact receiving vias 70. The signal integrity vias 72 may extend through the layers of the backplane circuit board 16.

In the embodiment shown, each pair of signal contact receiving vias 60 has a signal integrity via 72b and a signal integrity via 72c located on either side of the pair of signal contact receiving vias 60. In addition, another signal integrity via 72b is located between the signal contact receiving vias 60 of the pair of signal contact receiving vias 60. Signal integrity vias 72a are provide between adjacent ground contact receiving vias 70.

The signal integrity vias 72a, 72b, 72c cooperate to form a ground fence to shield the differential pairs of signal contact receiving vias 60 and the differential pairs of signal circuit board mounting sections 44 of the signal contacts 40 in the backplane connector 12. By providing the ground fence using the signal integrity vias 72a, 72b, 72c, the configuration of the backplane connector 12 and the positioning of the signal contacts 40 and the ground contacts 42 can be simplified. The ground fence in the backplane circuit board 16 provides the desired isolation or crosstalk reduction between the signal contact traces 62 and across the signal circuit board mounting sections 44 and the ground circuit board mounting sections 46 of the backplane connector 12.

It will be understood that the parameters of the footprint of the backplane connector 12 may vary, including the number and arrangement of the signal circuit board mounting sections 44 and the ground circuit board mounting sections 46. Consequently, the number and arrangement of the signal contact receiving vias 60 and the ground contact receiving vias 70 may vary to match the pattern of the signal circuit board mounting sections 44 and the ground circuit board mounting sections 46. In addition, the number and arrangement of the signal integrity vias 72a, 72b, 72c and the positioning of the first portions 64, the second portions 66, and transition portions 68 of the signal contact traces 62 may vary to provide for optimum shielding of the particular pattern of the signal circuit board mounting sections 44 and the ground circuit board mounting sections 46.

In one non-limiting example, the diameter of the signal contact receiving vias 60 is approximately 16 mils. The center-to-center spacing of the signal contact receiving vias 60 is approximately 71 mils, and the center-to-center spacing between rows of via patterns is approximately 71 mils. The ground contact vias 70 have diameters of approximately 16 mils. In this example, the signal integrity vias 72 have diameters of approximately 16 mils.

The number and arrangement of the signal integrity vias 72a, 72b, and 72c, provides an improved signal integrity than known circuit boards, thereby realizing reduced crosstalk between signal contact receiving vias 60 and the signal contact traces 62. The reduced crosstalk extends to very high operating frequencies, such as 18-30 GHz.

In various embodiments, ground strips 71 may be provided on a layer of the backplane circuit board 16, such as, but not limited to, the routing layer. The ground strips 71 are provided between the signal contact traces 62 and the signal integrity vias 72b to further reduced crosstalk between signal contact receiving vias 60 and the signal contact traces 62.

Figure 6:
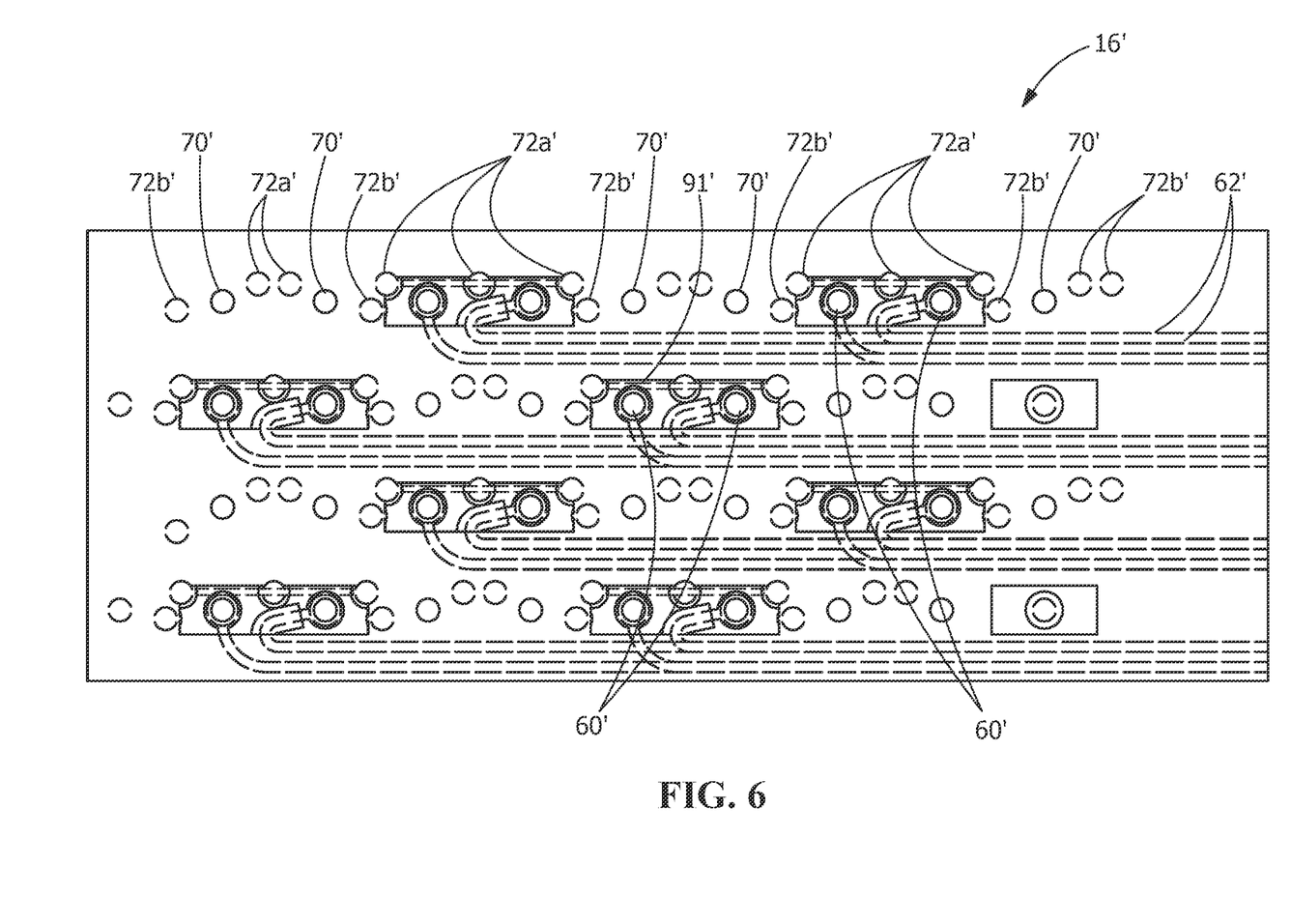
FIG. 6 is a top view of an alternate illustrative backplane.

FIG. 6 illustrates an alternate illustrative embodiment of the backplane circuit board 16'. In this embodiment, the backplane circuit board 16' has signal integrity vias or shadow vias 72'. The signal integrity vias 72' are proximate to or between the signal contact receiving vias 60' and/or the ground contact receiving vias 70'. In the illustrative embodiment shown in FIG. 6, the various signal integrity vias 72a' are positioned in line above an axis of a row of respective signal contact receiving vias 60' and ground contact receiving vias 70'. Other respective signal integrity vias 72b' are positioned below the axis of the row.

Signal contact traces 62' are provided on the backplane circuit board 16' and terminate at respective signal contact receiving vias 60'. In the illustrative embodiment shown, each of the signal contact traces 62' extend in an essentially straight line.

The other components and operation of the backplane circuit board 16' is similar to that of backplane circuit board 16 and will not be repeated.

Figure 5:
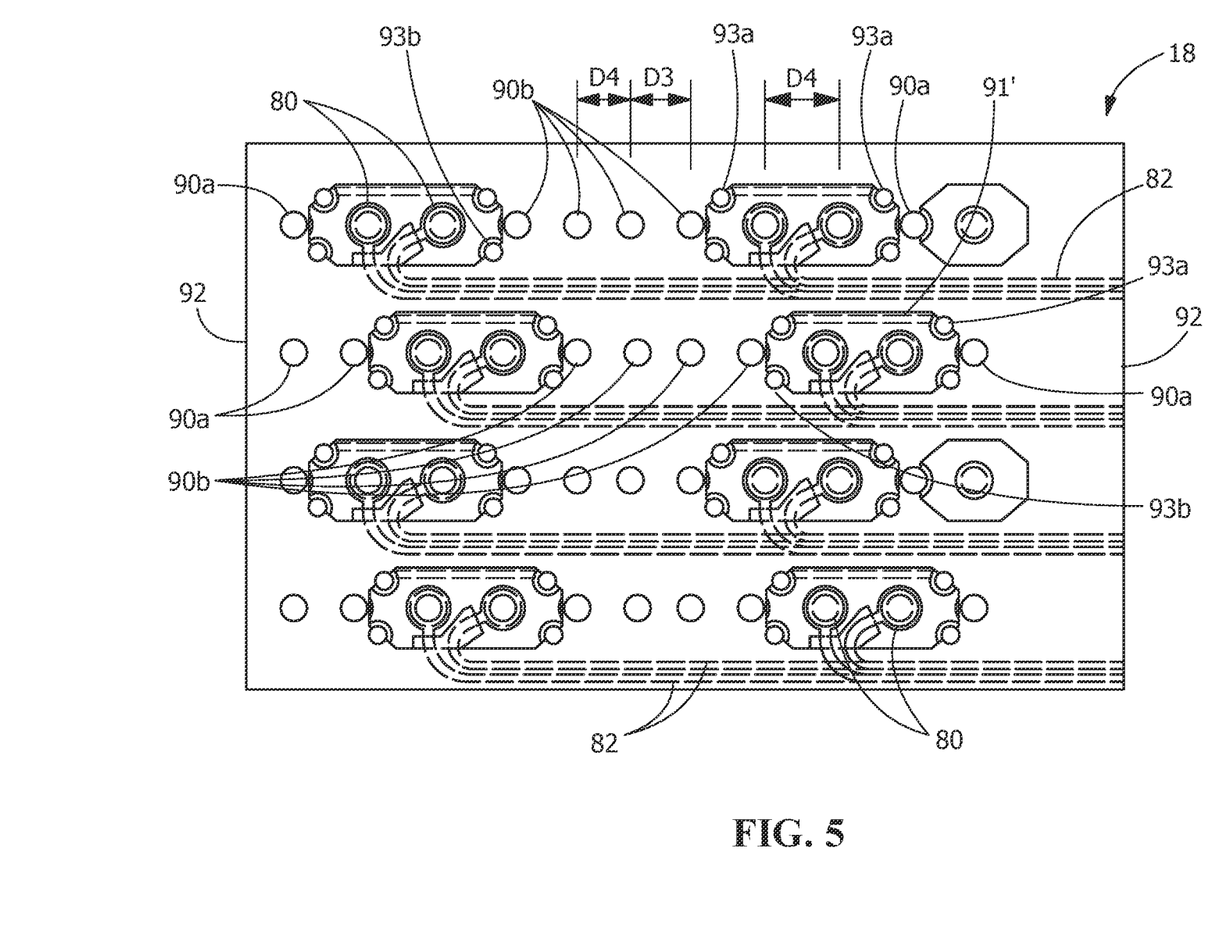
FIG. 5 is a top view of the daughter board similar to that shown in of FIG. 1.

Referring to FIG. 5, the daughtercard circuit board 18 has signal contact receiving through-holes or vias 80 which are configured and positioned to electrically and mechanically engaged the signal mounting pins 26 of the daughter card connector 14. In the embodiment shown, the signal contact receiving vias 80 are arranged in pairs carrying differential signals. Signal contact traces 82 are provided on the daughtercard circuit board 18 and terminate at respective signal contact receiving vias 80. The signal contact traces 82 from the differential pair of the signal contact receiving vias 80 may be on different layers of the backplane circuit board 18.

The daughter circuit board 18 has signal integrity vias or shadow vias 93. The signal integrity vias 93 are proximate to or between the signal contact receiving vias 80 and the ground contact receiving vias 90. In the illustrative embodiment shown in FIG. 5, the various signal integrity vias 93a are positioned above the axis of the row, while other respective signal integrity vias 93b are positioned below the axis of the row.

The signal integrity vias 93 may have a different (smaller or larger) diameter than the signal contact receiving vias 80 and the ground contact receiving vias 90. The signal integrity vias 93 may extend through the layers of the daughter circuit board 18. In the embodiment shown, each pair of signal contact receiving vias 80 has a signal integrity via 93a and a signal integrity vias 93*b* located on either side of the pair of signal contact receiving vias 80.

The signal integrity vias 93*a*, 93*b* cooperate to form a ground fence to shield the differential pairs of signal contact receiving vias 80. By providing the ground fence using the signal integrity vias 93*a*, 93*b*, the configuration of the daughter card connector 14 can be simplified. The ground fence in the daughter circuit board 18 provides the desired isolation or crosstalk reduction between the signal contact traces 82 and across the signal mounting pins 26 and the ground mounting pins 28 of the daughter card connector 14.

The number and arrangement of the signal integrity vias 93*a*, 93*b*, provides an improved signal integrity than known circuit boards, thereby realizing reduced crosstalk between signal contact receiving vias 80 and the signal contact traces 82. The reduced crosstalk extends to very high operating frequencies, such as 18-30 GHz.

In various embodiments, ground strips 91 may be provided on a layer of the daughtercard circuit board 18, such as, but not limited to, the routing layer. The ground strips 91 are provided between the signal contact traces 82 and the signal integrity vias 93*a* to further reduced crosstalk between signal contact receiving vias 80 and the signal contact traces 82.

The daughtercard circuit board 18 has ground contact receiving through-holes or vias 90 which are configured and positioned to electrically and mechanically engaged the ground mounting pins 28 of the ground contacts 42 of the daughter card connector 14. In the embodiment shown, respective ground contact receiving vias 90 are arranged in line and spaced from respective signal contact receiving vias 80. The daughtercard circuit board 18 has first ground contact receiving vias 90*a* and second ground contact receiving vias 90*b*. The first ground contact receiving vias 90*a* are positioned between an edge 92 of the daughtercard circuit board 18 and a respective signal contact receiving via 80. The second ground contact receiving vias 90*b* are positioned between respective signal contact receiving via 80.

The center-to-center spacing D3 and D4 between the second ground contact receiving vias 90*b* is less than the center-to-center spacing D5 between the signal contact receiving vias 80. It will be understood that the pattern or positioning of the signal contact vias 70 and the ground contact receiving vias 90 matches the pattern of the signal mounting pins 26 and the ground mounting pins 28 of the daughtercard circuit board 18. The use of second ground contact receiving vias 90*b* which are more closely spaced allows for more second ground contact receiving vias 90*b* to be provided between the signal contact receiving vias 80. The increased grounding in the daughtercard circuit board 18 provides the desired isolation or crosstalk reduction across the signal mounting pins 26 and ground mounting pins 28 of the daughtercard circuit board 18.

It will be understood that the parameters of the footprint of the daughtercard circuit board 18 may vary, including the number and arrangement of the signal mounting pins 26 and the ground mounting pins 28. Consequently, the number and arrangement of the signal contact receiving vias 80 and the ground contact receiving vias 90 may vary to match the pattern of the signal mounting pins 26 and the ground mounting pins 28.

In one non-limiting example, the center-to-center spacing of the signal contact receiving vias 80 is approximately 15 mils, and the center-to-center spacing between rows of via patterns may be is approximately 71 mils. The center-to-center spacing D3 of the outer second ground contact receiving vias 90*b* is approximately 33 mils and the center-to-center spacing D3 of the inner second ground contact receiving vias 90*b* is approximately 29 mils.

The positioning of the second ground contact receiving vias 90*b* allows respective second ground contact receiving vias 90*b* in each row to be positioned in line. This allows any ground plates positioned in the housing 24 to have a planar configurations, as the ground plate mounting pins can be aligned in a straight row.

The number and arrangement of the second ground contact receiving vias 90*b* provides better impedance control and improved signal integrity than known circuit boards, thereby providing reduced crosstalk between signal contact receiving vias 80. The reduced crosstalk extends to very high operating frequencies, such as 18-30 GHz.

Figure 7:
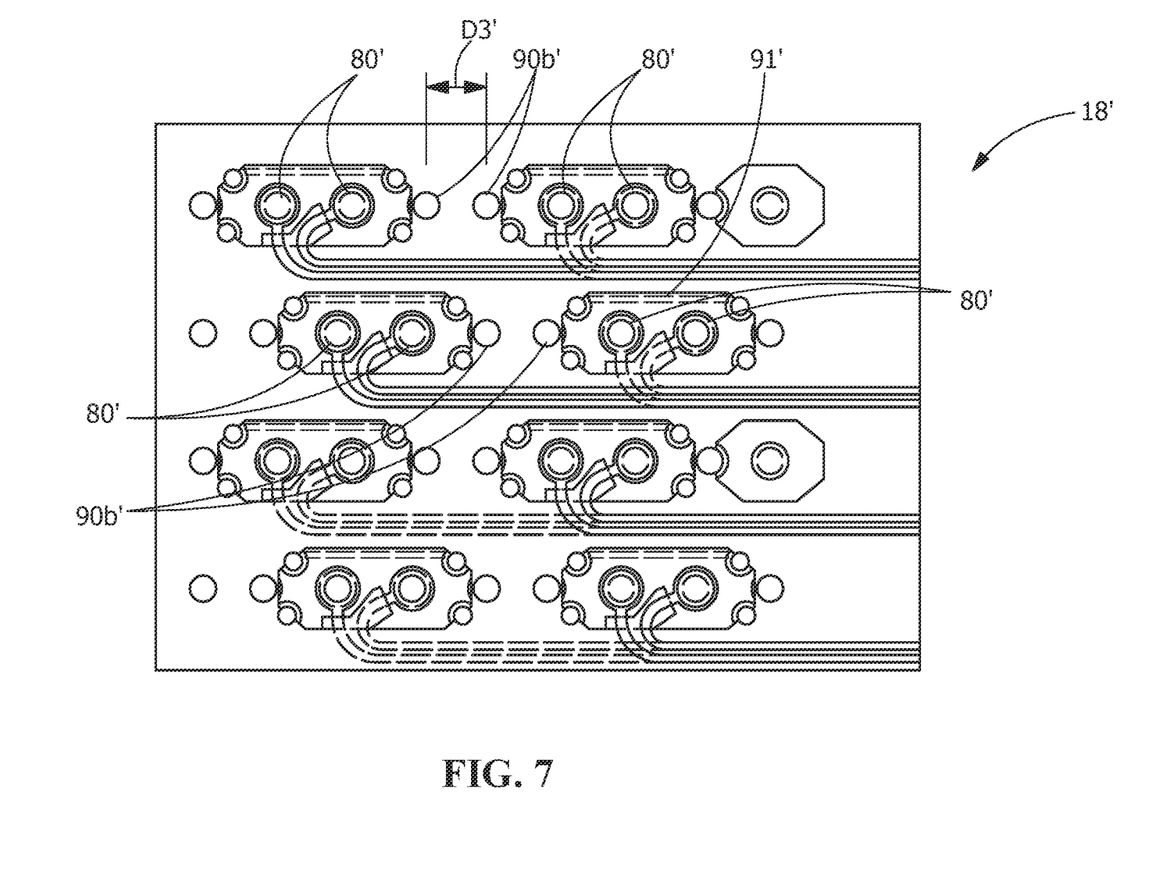
FIG. 7 is a top view of an alternate illustrative daughter board.

FIG. 7 illustrates an alternate illustrative embodiment of the daughtercard circuit board 18'. In this embodiment, the daughtercard circuit board 18' has two second ground contact receiving vias 90*b*' positioned respective signal contact receiving via 80' instead of the four second ground contact receiving vias 90*b* shown in FIG. 5. In addition, the spacing D3' may vary from the spacing D3. However, the other components and operation of the daughtercard circuit board 18' is similar to that of daughtercard circuit board 18 and will not be repeated.

The ground fence of the backplane circuit board using the signal integrity vias shield the differential signal contacts at the foot print of the backplane connector to reduce crosstalk in the foot print, thereby simplifying the stamped shield needed for the backplane connector. Similarly, the positioning of the ground contact receiving vias in the daughtercard circuit board provides additional shielding to reduce crosstalk in the foot print, thereby simplifying or eliminating the stamped shield needed for the backplane connector.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A printed circuit board comprising:
   signal contact receiving vias positioned in rows;
   ground contact receiving vias positioned in line with the signal contact receiving vias in the rows;
   signal integrity vias positioned between the signal contact receiving vias, between the ground contact receiving vias, and between respective signal contact receiving vias and respective ground contact receiving vias;
   the signal integrity vias forming a ground fence which reduces cross talk in a foot print of a connector mated with the printed circuit board.

2. The printed circuit board as recited in claim 1, wherein the signal contact receiving vias are arranged in pairs carrying differential signals.

3. The printed circuit board as recited in claim 1, wherein the circuit board has signal contact traces which terminate at respective signal contact receiving vias.

4. The printed circuit board as recited in claim 3, wherein the signal integrity vias have first signal integrity vias positioned in line with an axis of a row of respective signal contact receiving vias and ground contact receiving vias, second signal integrity vias positioned above the axis of the row, and third signal integrity vias are positioned below the axis of the row.

5. The printed circuit board as recited in claim 4, wherein the signal contact traces have first portions which are positioned in line with each other, second portions which are positioned in line with each other, the first portions and the second portions are offset from each other, transition portions are positioned between the first portions and the second portions.

6. The printed circuit board as recited in claim 5, wherein the signal integrity vias have a smaller diameter than the signal contact receiving vias and the ground contact receiving vias.

7. The printed circuit board as recited in claim 6, wherein each pair of signal contact receiving vias has second signal integrity vias and third signal integrity vias located on either side of the pair of signal contact receiving vias.

8. The printed circuit board as recited in claim 7, wherein one second signal integrity via of the second signal integrity vias is located between the signal contact receiving vias of the pair of signal contact receiving vias.

9. The printed circuit board as recited in claim 8, wherein first signal integrity vias are provide between adjacent ground contact receiving vias.

10. The printed circuit board as recited in claim 3, wherein the signal integrity vias have first signal integrity vias positioned above an axis of a row of respective signal contact receiving vias and ground contact receiving vias, and second signal integrity vias positioned below the axis of the row.

11. The printed circuit board as recited in claim 10, wherein each pair of signal contact receiving vias has first signal integrity vias and second signal integrity vias located on either side of the pair of signal contact receiving vias.

12. The printed circuit board as recited in claim 11, wherein one first signal integrity via of the second signal integrity vias is located between the signal contact receiving vias of the pair of signal contact receiving vias.

13. The printed circuit board as recited in claim 12, wherein first signal integrity vias are provide between adjacent ground contact receiving vias.

14. A printed circuit board comprising:
signal contact receiving vias positioned in rows;
first ground contact receiving vias positioned in line with the signal contact receiving vias in the rows, the first ground contact receiving vias positioned between and edge of the circuit board and the signal contact receiving vias;
second ground contact receiving vias positioned in line with the signal contact receiving vias in the rows, the second ground contact receiving vias positioned between respective signal contact receiving vias;
the second contact receiving vias having center-to-center spacing which is less than the center-to-center spacing between the signal contact receiving vias.

15. The printed circuit board as recited in claim 14, wherein the center-to-center spacing of the signal contact receiving vias is approximately 33 mils, and the center-to-center spacing of the second ground contact receiving vias is 29 mils.

16. A connector system comprising:
a backplane connector having first signal contacts and first ground contacts;
a daughtercard connector having second signal contacts and second ground contacts;
a backplane circuit board comprising:
backplane signal contact receiving vias positioned in rows;
backplane ground contact receiving vias positioned in line with the backplane signal contact receiving vias in the rows;
signal integrity vias positioned between the backplane signal contact receiving vias, between the backplane ground contact receiving vias, and between respective backplane signal contact receiving vias and respective backplane ground contact receiving vias;
a daughtercard circuit board comprising:
daughtercard signal contact receiving vias positioned in rows;
first daughtercard ground contact receiving vias positioned in line with the daughtercard signal contact receiving vias in the rows, the first daughtercard ground contact receiving vias positioned between and edge of the daughtercard circuit board and the daughtercard signal contact receiving vias;
second daughtercard ground contact receiving vias positioned in line with the daughtercard signal contact receiving vias in the rows, the second daughtercard ground contact receiving vias positioned between respective daughtercard signal contact receiving vias;
the daughtercard second contact receiving vias having center-to-center spacing which is less than the center-to-center spacing between the daughtercard signal contact receiving vias.

17. The connector system as recited in claim 16, wherein the backplane signal contact receiving vias and the daughtercard signal contact receiving vias are arranged in pairs carrying differential signals.

18. The connector system as recited in claim 17, wherein the backplane circuit board has signal contact traces which terminate at respective backplane signal contact receiving vias.

19. The connector system as recited in claim 18, wherein the signal integrity vias have first signal integrity vias positioned in line with an axis of a row of respective backplane signal contact receiving vias and backplane ground contact receiving vias, second signal integrity vias positioned above the axis of the row, and third signal integrity vias are positioned below the axis of the row.

20. The connector system as recited in claim 18, wherein the signal integrity vias have first signal integrity vias positioned above an axis of a row of respective backplane signal contact receiving vias and backplane ground contact receiving vias, and second signal integrity vias positioned below the axis of the row.

* * * * *